(12) United States Patent
Huet et al.

(10) Patent No.: US 7,006,886 B1
(45) Date of Patent: Feb. 28, 2006

(54) DETECTION OF SPATIALLY REPEATING SIGNATURES

(75) Inventors: Patrick Y. Huet, San Jose, CA (US); Robinson Piramuthu, San Jose, CA (US); Martin Plihal, Pleasanton, CA (US)

(73) Assignee: KLA Tencor-Technologies Corporation, Milpitas, CA (US)

( * ) Notice: Subject to any disclaimer, the term of this patent is extended or adjusted under 35 U.S.C. 154(b) by 0 days.

(21) Appl. No.: 10/755,546

(22) Filed: Jan. 12, 2004

(51) Int. Cl.
*G06F 19/00* (2006.01)
(52) U.S. Cl. .................................... 700/110; 438/16
(58) Field of Classification Search ............... 700/110, 700/109, 121, 117; 702/183, 184, 185, 84; 438/14, 16
See application file for complete search history.

(56) References Cited

U.S. PATENT DOCUMENTS

| | | | |
|---|---|---|---|
| 5,502,306 A * | 3/1996 | Meisburger et al. | 250/310 |
| 6,088,712 A * | 7/2000 | Huang et al. | 715/526 |
| 6,167,150 A * | 12/2000 | Michael et al. | 382/149 |
| 6,630,996 B1 * | 10/2003 | Rao et al. | 356/237.5 |
| 6,701,259 B1 * | 3/2004 | Dor et al. | 702/35 |
| 2002/0035435 A1 * | 3/2002 | Ninomiya et al. | 702/35 |
| 2002/0161532 A1 * | 10/2002 | Dor et al. | 702/35 |
| 2003/0135295 A1 * | 7/2003 | Dor et al. | 700/108 |
| 2004/0122859 A1 * | 6/2004 | Gavra et al. | 707/104.1 |
| 2004/0158409 A1 * | 8/2004 | Teshima et al. | 702/22 |

* cited by examiner

*Primary Examiner*—Zoila Cabrera
(74) *Attorney, Agent, or Firm*—Luedeka, Neely & Graham, P.C.

(57) ABSTRACT

A method for analyzing defects on a substrate, including inspecting the substrate to detect the defects, identifying the defects by location, analyzing the defects to detect extended objects, and analyzing the extended objects for repetition across the substrate. Thus, the present invention extends beyond the present analysis methods, by analyzing the extended objects for repetition across the substrate. In this manner, correlation with processing problems can be more readily detected, in cases where the individual defects themselves, of which the extended objects are formed, do not appear to have repeating properties.

8 Claims, 3 Drawing Sheets

DETECTION OF SPATIALLY REPEATING SIGNATURES

FIELD

This invention relates to the field of integrated circuit fabrication. More particularly, this invention relates to detecting defects on substrates and identifying the causes of such defects.

BACKGROUND

The implementation of advanced process control methods in integrated circuit fabrication, such as semiconductor device manufacturing of the type that uses monolithic substrates of group IV materials such as silicon or germanium or group III–V compounds such as gallium arsenide, has been primarily focused on the early detection and automatic root cause analysis of process problems. A significant portion of this effort deals with identifying so-called killer defects and controlling the level of such on production substrates. Frequently, defects that are traceable to a particular process problem appear in visually recognizable or spatially repeating patterns. The detection of such repeating defect clusters, signatures, and individual defects is an important and useful indicator of a process problem. It is particularly effective for the early detection of process excursion conditions when defect patterns on the substrate are not yet fully developed.

Spatial correlation of substrate defects is a common practice in current process control systems. For example, defect source analysis correlates spatial defects between process steps of individual substrates and source steps for each defect. Repeater analysis looks for defects on a substrate that repeat with the periodicity of reticle steppers. Repeater analysis is therefore performed to identify reticle defects. However, all of these analyses are based on a defect to defect correlation rather than on a more global cluster to cluster correlation.

Defect to defect correlations are useful in identifying physically identical sources of the defects, such as defects that propagate through processing steps or reticle irregularity. However, defect correlations are less useful for identifying process problems across substrates that underwent common process steps. The defect level correlation is often quite weak in such cases.

What is needed, therefore, is a system for identifying process problems that do not necessarily have a strong correlation with the spatial location or spatial repetition of individual defects.

SUMMARY

The above and other needs are met by a method for analyzing defects on a substrate, including inspecting the substrate to detect the defects, identifying the defects by location, analyzing the defects to detect extended objects, and analyzing the extended objects for repetition across the substrate.

In this manner, the present invention extends beyond the present analysis methods, by analyzing the extended objects for repetition across the substrate. In this manner, correlation with processing problems can be more readily detected, in cases where the individual defects themselves, of which the extended objects are formed, do not appear to have repeating properties.

In various embodiments, the inspection of the substrate is an optical inspection. Preferably, the substrate is a monolithic semiconducting substrate having integrated circuitry thereon. Alternately, the substrate is a reticle or a mask. The extended objects preferably include at least one of clusters and signatures. The step of analyzing the defects to detect extended objects preferably includes specifying a bounding box size. Most preferably, the step of analyzing the extended objects for repetition includes specifying at least one of a bounding box size, a bounding box orientation, and a bounding box overlap.

According to another aspect of the invention there is described an apparatus for analyzing defects on a substrate. A sensor inspects the substrate, and a stage provides relative movement between the sensor and the substrate. A controller correlates defect information from the sensor and position information from the stage, analyzes the correlated defect information and position information to detect extended objects, and analyzes the extended objects for repetition across the substrate.

In various embodiments, an input receives at least one of a bounding box size, a bounding box orientation, and a bounding box overlap as adjustable parameters for use in detecting and analyzing the extended objects for repetition. The substrate is preferably at least one of a semiconductor substrate, a reticle, and a mask. The sensor is preferably an optical sensor.

BRIEF DESCRIPTION OF THE DRAWINGS

Further advantages of the invention are apparent by reference to the detailed description when considered in conjunction with the figures, which are not to scale so as to more clearly show the details, wherein like reference numbers indicate like elements throughout the several views, and wherein.

DETAILED DESCRIPTION

Figure 1:
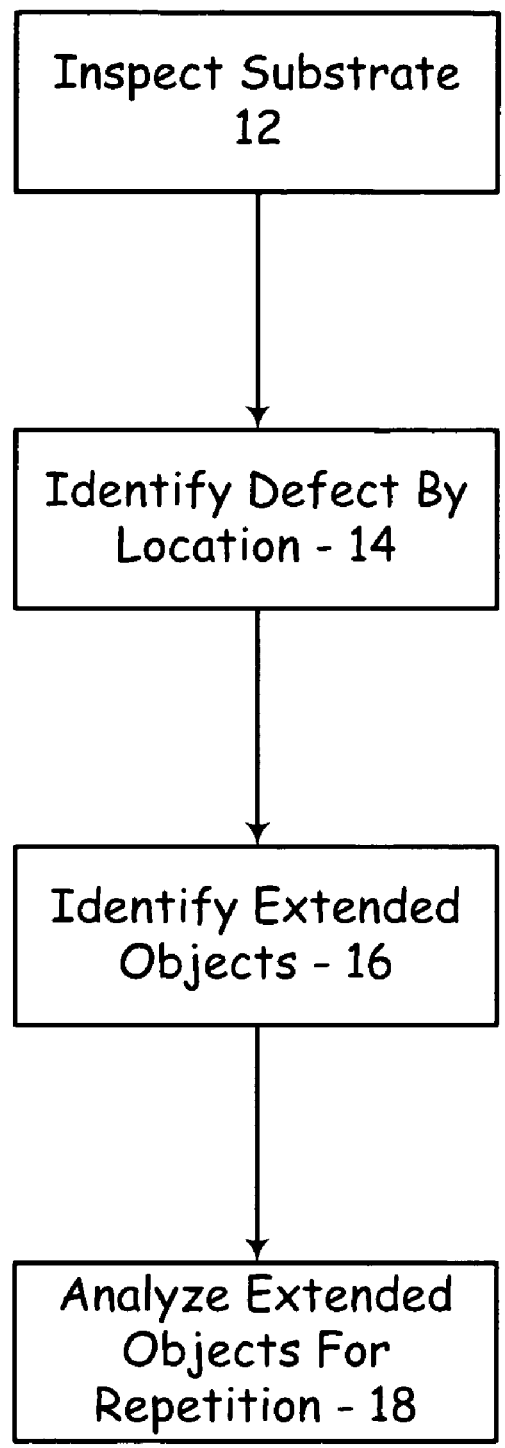
FIG. 1 is a flow chart of a method according to a preferred embodiment of the present invention.

With reference now to FIG. 1, there is depicted a method 10 of inspecting a substrate according to a preferred embodiment of the present invention. As given in box 12, the substrate is inspected, preferably with an optical inspection. The substrate is most preferably a monolithic semiconductor substrate, such as the type used for the fabrication of integrated circuits. However, in other embodiments the substrate is a masking structure, such as a photolithographic mask that contains patterns for an entire substrate of integrated circuits, or a reticle that includes patterns for just one or more integrated circuits on a substrate. In some embodiments, the apparatus in which the invention may be embodied is operable to inspect all such substrates.

The defects that are discovered on the surface of the substrate as given in block 14, are preferably associated with a location on the substrate, and this defect information is most preferably stored such as in a memory of some type. The defect information is analyzed as given in block 16 to identify extended objects. Extended objects are patterns of individual defects, such as clusters or signatures. Most preferably the operator of the system is able to specify certain parameters in regard to the identification of such extended objects, such as, but not limited to, the bounding box size, orientation, and degree of overlap.

Once the extended objects have been identified, the system attempts to identify repeating patterns of one or more of the extended objects, as given in block 18. Again, it is most preferable that the operator of the system is able to specify certain parameters in regard to the identification of such repeating patterns of extended objects, such as, but not limited to, the bounding box size, orientation, and overlap.

Figure 2:
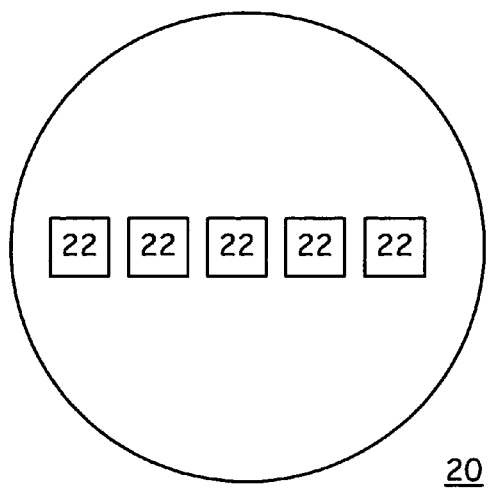
FIG. 2 is an example of a linear repeating pattern of extended objects.
Figure 3:
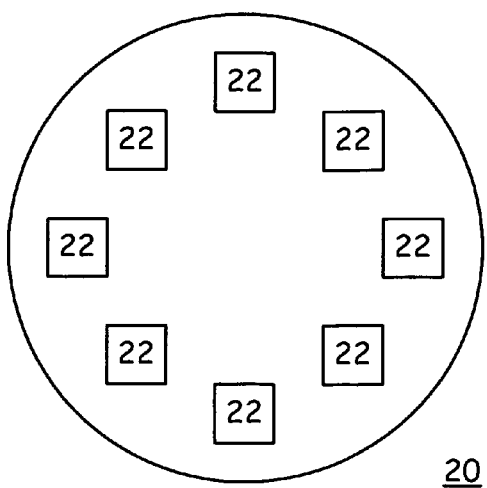
FIG. 3 is an example of a circular repeating pattern of extended objects.

For example, FIG. 2 depicts a substrate 20 having a linear repeating pattern of extended objects 20. In the example of FIG. 2, the pattern is relatively easily recognizable, because the bounding boxes that surround the patterns of individual defects that comprise the extended objects 20 do not overlap, are disposed in an extremely similar orientation, and follow a simple linear pattern. FIG. 3 depicts a substrate 20 having a circular repeating pattern, where again the bounding boxes that surround the patterns of individual defects that comprise the extended objects 20 do not overlap, are disposed in an extremely similar orientation, and follow a simple circular pattern. It is appreciated that in many if not most instances, the repeating patterns of extended objects 22 may be much harder to recognize.

Figure 4:
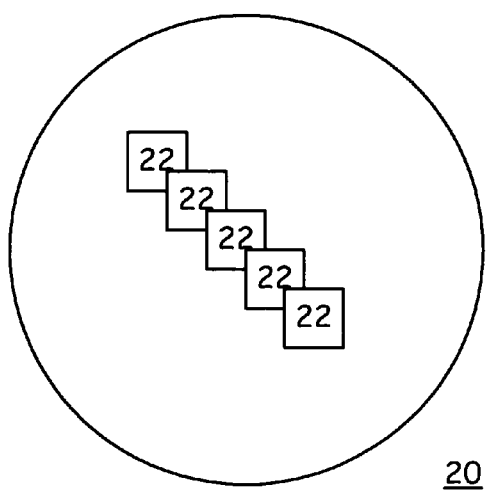
FIG. 4 is an example of a linear repeating pattern of overlapping extended objects.
Figure 5:
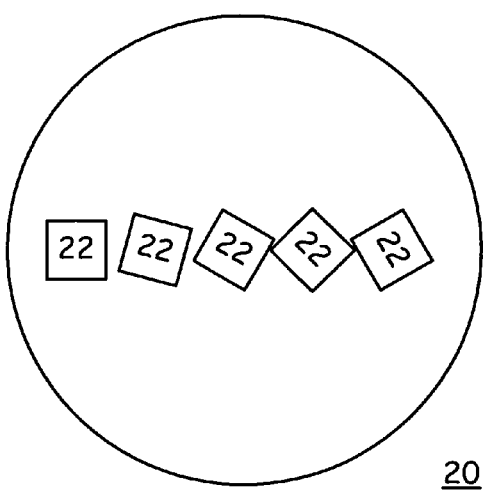
FIG. 5 is an example of a linear repeating pattern of extended objects having differing orientations.

For example, the bounding boxes may overlap to some degree, as depicted in FIG. 4, or the bounding boxes may be oriented differently one to another, as depicted in FIG. 5. Further still, the size of the bounding boxes may need to be adjusted, even from extended object to extended object, in order to recognize the objects. Finally, many different permutations of such parameters in regard to the bounding boxes may exist, and thus these different combinations may need to be investigated in order to detect a repeating pattern of extended objects 22 on the substrate 20. If such parameters are not variable, such as input through a user interface or specified as a part of a recipe, then a repeating pattern of extended objects may be confounded by what appears to be an unpatterned blur of individual defects.

Figure 6:
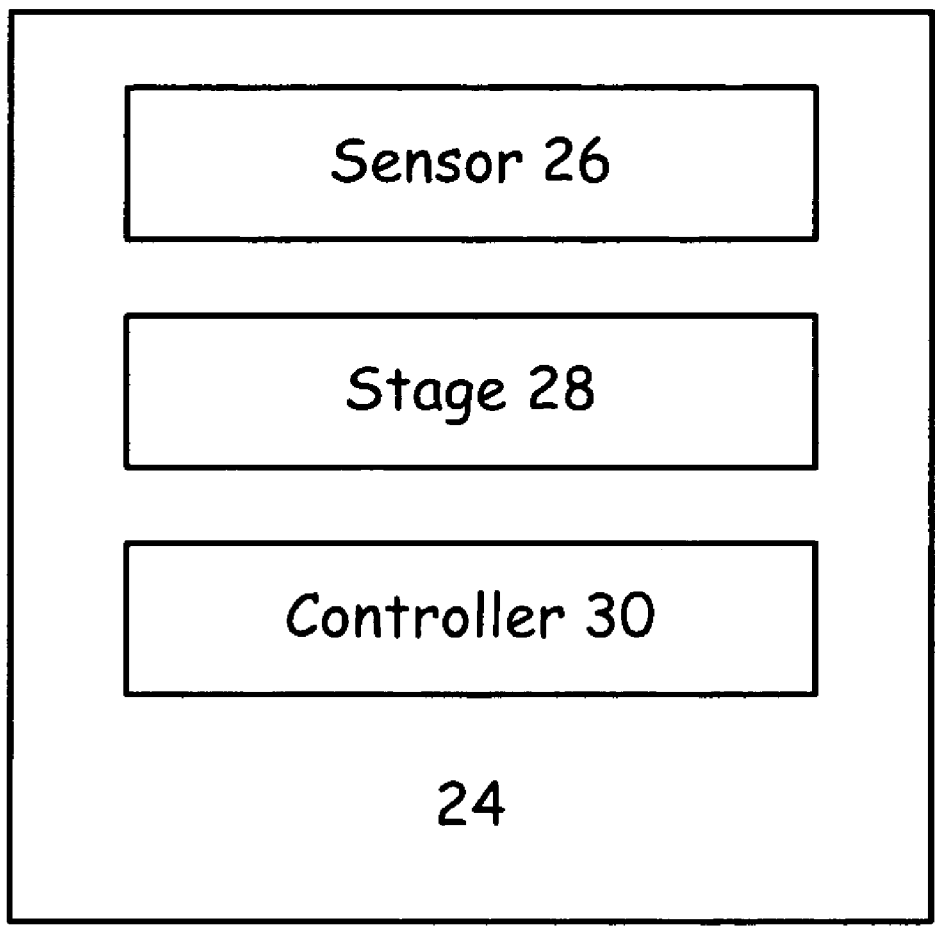
FIG. 6 is a functional block diagram of an apparatus for inspecting substrates according to preferred embodiment of the present invention.

FIG. 6 depicts a functional block diagram of an apparatus 24 according to a preferred embodiment of the present invention, including a sensor 26, which as mentioned above, is preferably an optical sensor. A stage 28 preferably provides relative movement between the sensor 26 and the substrate 20, and a controller 30 gathers the defect data, and makes the analyses as described above. It is appreciated that there will in many embodiments be additional functional parts of the apparatus 24, including items such as a memory, a display, a user input, and network communication means.

It is appreciated that the logic means by which the various analyses described above is implemented may take one or more of a variety of different embodiments. For example, the logic means may reside within a prior art inspection tool, and in such an embodiment could be implemented as a firmware or programming upgrade to the inspection tool. Alternately, the logic means may be built in to a new inspection tool specifically designed to implement the methods of the present invention. Further yet, the logic means may be remotely located from an inspection tool, such as on a personal computer, which is used to analyze inspection data that has been gathered at a different location and at a different time. Thus, there are many different embodiments for the analysis functions as described herein.

Thus, the present invention enhances process control, by detecting repeating patterns or signatures on a substrate, rather than merely looking for individual defects which repeat with some periodicity on the substrate. This repeating signature detection analysis provides several benefits. For example, it is preferably a recipe driven analysis that looks for repeating defect distributions with certain properties, such as repeating defect clusters of certain shapes. In this manner, commonality is preferably not based on defect to defect correlation, but rather on an overlay criterion between the entire extended object (cluster, spatial signature, and so forth).

As introduced above, several overlay criteria are configurable by setting different recipe parameters. Such overlay criteria include, for example, the level of overlap between oriented bounding boxes around two clusters that are being compared. In addition, the relative orientation between the bounding boxes of compared clusters may also be a configurable criteria. Further, only the overlap between spatial signatures of the same class as classified by spatial signature analysis might be used. It is appreciated that these examples of overlay criteria are not by way of limitation, but by way of example of the different types of criteria that may be specified by a user, such as through a recipe.

The results of the analysis are preferably statistical in nature, and are most preferably determined in conjunction with various thresholds, such as sensitivity thresholds, that are specified by the user, such as through a recipe. The statistics are preferably based on the level or degree of overlap between pairs of clusters, as well as the number of matching clusters.

The foregoing description of preferred embodiments for this invention has been presented for purposes of illustration and description. It is not intended to be exhaustive or to limit the invention to the precise form disclosed. Obvious modifications or variations are possible in light of the above teachings. The embodiments are chosen and described in an effort to provide the best illustrations of the principles of the invention and its practical application, and to thereby enable one of ordinary skill in the art to utilize the invention in various embodiments and with various modifications as are suited to the particular use contemplated. All such modifications and variations are within the scope of the invention as determined by the appended claims when interpreted in accordance with the breadth to which they are fairly, legally, and equitably entitled.

What is claimed is:

1. A method for analyzing defects on a substrate, the method including the steps of:
    optically inspecting the substrate to detect the defects,
    identifying the defects by location,
    analyzing the defects to detect extended objects, by
        enclosing groups of the defects within bounding boxes with different sizes to determine whether a given group of defects defines a given extended object, even though the size of the bounding box surrounding the given group of defects is different than the size of other bounding boxes surrounding other groups of defects that have also been defined as the given extended object,
        enclosing groups of the defects within bounding boxes with different orientations to determine whether a given group of defects defines a given extended object, even though the orientation of the bounding box surrounding the given group of defects is different than the orientation of other bounding boxes surrounding other groups of defects that have also been defined as the given extended object, and enclosing groups of the defects within bounding boxes with a different degree of overlap to determine whether a given group of defects defines a given extended object, even though the degree of overlap of the bounding box surrounding the given group of defects is different than the degree of overlap of other bounding boxes surrounding other groups of defects that have also been defined as the given extended object, and analyzing a set of the given extended objects for an identifiable pattern of repetition across the substrate.

2. The method of claim 1, wherein the substrate is a monolithic semiconducting substrate having integrated circuitry thereon.

3. The method of claim 1, wherein the substrate is a reticle.

4. The method of claim 1, wherein the substrate is a mask.

5. The method of claim 1, wherein the extended objects include at least one of clusters and signatures.

6. An apparatus for analyzing defects on a substrate, the apparatus comprising:

a sensor for inspecting the substrate and providing defect information, a stage for providing relative movement between the sensor and the substrate and providing position information, an input for receiving at least one of a bounding box size, a bounding box orientation, and a bounding box overlap as adjustable parameters, and a controller for;

correlating defect information from the sensor and position information from the stage to define defects, analyzing the correlated defect information and position information to detect extended objects, by enclosing groups of the defects within bounding boxes with different sizes to determine whether a given group of defects defines a given extended object, even though the size of the bounding box surrounding the given group of defects is different than the size of other bounding boxes surrounding other groups of defects that have also been defined as the given extended object, enclosing groups of the defects within bounding boxes with different orientations to determine whether a given group of defects defines a given extended object, even though the orientation of the bounding box surrounding the given group of defects is different than the orientation of other bounding boxes surrounding other groups of defects that have also been defined as the given extended object, and enclosing groups of the defects within bounding boxes with a different degree of overlap to determine whether a given group of defects defines a given extended object, even though the degree of overlap of the bounding box surrounding the given group of defects is different than the degree of overlap of other bounding boxes surrounding other groups of defects that have also been defined as the given extended object, and analyzing a set of the given extended objects for an identifiable pattern of repetition across the substrate.

7. The apparatus of claim 6 wherein the substrate is at least one of a semiconductor substrate, a reticle, and a mask.

8. The apparatus of claim 6 wherein the sensor is an optical sensor.

* * * * *